United States Patent
Hsieh et al.

(10) Patent No.: US 9,991,158 B2
(45) Date of Patent: Jun. 5, 2018

(54) SEMICONDUCTOR DEVICE, LAYOUT OF SEMICONDUCTOR DEVICE, AND METHOD OF MANUFACTURING SEMICONDUCTOR DEVICE

(71) Applicant: TAIWAN SEMICONDUCTOR MANUFACTURING COMPANY, LTD., Hsinchu (TW)

(72) Inventors: Tung-Heng Hsieh, Zhudong Town (TW); Hui-Zhong Zhuang, Kaohsiung (TW); Chung-Te Lin, Tainan (TW); Sheng-Hsiung Wang, Zhubei (TW); Ting-Wei Chiang, New Taipei (TW); Li-Chun Tien, Tainan (TW); Tsung-Chieh Tsai, Chu-Bei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 14/484,670

(22) Filed: Sep. 12, 2014

(65) Prior Publication Data
US 2016/0079162 A1    Mar. 17, 2016

(51) Int. Cl.
*H01L 21/28* (2006.01)
*H01L 21/768* (2006.01)
(Continued)

(52) U.S. Cl.
CPC .. *H01L 21/76877* (2013.01); *H01L 21/28008* (2013.01); *H01L 21/76829* (2013.01);
(Continued)

(58) Field of Classification Search
CPC ......... H01L 21/823475; H01L 27/0207; H01L 27/088; H01L 23/52–23/5389; H01L 21/768–21/76897
(Continued)

(56) References Cited

U.S. PATENT DOCUMENTS 5,943,598 A * 8/1999 Lin .............. H01L 21/768
257/E21.575
6,657,302 B1 * 12/2003 Shao .............. H01L 23/5222
257/758
(Continued)

FOREIGN PATENT DOCUMENTS

JP    2001186003    7/2001
JP    2004274016    9/2004
(Continued)

OTHER PUBLICATIONS

Office Action dated Apr. 1, 2016 (and English translation) from corresponding No. KR 10-2014-0186934.
(Continued)

*Primary Examiner* — Julio J Maldonado
*Assistant Examiner* — Stanetta Isaac
(74) *Attorney, Agent, or Firm* — Hauptman Ham, LLP

(57) ABSTRACT

A semiconductor device includes a substrate having an active area, a gate structure over the active area, a lower conductive layer over and electrically coupled to the active area, and an upper conductive layer over and electrically coupled to the lower conductive layer. The lower conductive layer is at least partially co-elevational with the gate structure. The lower conductive layer includes first and second conductive segments spaced from each other. The upper conductive layer includes a third conductive segment overlapping the first and second conductive segments. The third conductive segment is electrically coupled to the first conductive segment, and electrically isolated from the second conductive segment.

19 Claims, 8 Drawing Sheets

(51) Int. Cl.
  *H01L 27/02* (2006.01)
  *H01L 21/8234* (2006.01)
  *H01L 27/088* (2006.01)
  *H01L 21/265* (2006.01)

(52) U.S. Cl.
  CPC .. *H01L 21/76831* (2013.01); *H01L 21/76895* (2013.01); *H01L 21/76897* (2013.01); *H01L 21/823475* (2013.01); *H01L 27/0207* (2013.01); *H01L 21/2658* (2013.01); *H01L 27/088* (2013.01)

(58) Field of Classification Search
  USPC ....... 438/128, 599, 598, 129, 618, 620, 622, 438/625
  See application file for complete search history.

(56) References Cited

U.S. PATENT DOCUMENTS

| | | | |
|---|---|---|---|
| 2009/0072289 A1 | 3/2009 | Kim et al. | |
| 2009/0090948 A1 | 4/2009 | Sato | |
| 2010/0081232 A1* | 4/2010 | Furman | H01L 21/2007 438/107 |
| 2010/0314687 A1 | 12/2010 | Xu | |
| 2011/0291200 A1* | 12/2011 | Keshavarzi | H01L 21/823871 257/369 |
| 2012/0168899 A1* | 7/2012 | Kim | H01L 21/7682 257/522 |
| 2012/0223412 A1* | 9/2012 | Baars et al. | 257/532 |
| 2013/0175589 A1 | 7/2013 | Chen | |
| 2015/0036437 A1* | 2/2015 | Li | G11C 16/10 365/185.33 |
| 2016/0005749 A1* | 1/2016 | Li | H01L 27/11521 257/295 |

FOREIGN PATENT DOCUMENTS

| | | |
|---|---|---|
| KR | 20080089146 | 10/2008 |
| KR | 10-2010-0094905 | 8/2010 |
| TW | 201351653 | 12/2013 |

OTHER PUBLICATIONS

Notice of Allowance dated Dec. 15, 2016 and English translation from corresponding application No. KR 10-2014-0186934.
Search Report from corresponding application No. TW104130055.
Allowance from corresponding application No. TW104130055.

* cited by examiner

US 9,991,158 B2

SEMICONDUCTOR DEVICE, LAYOUT OF SEMICONDUCTOR DEVICE, AND METHOD OF MANUFACTURING SEMICONDUCTOR DEVICE

BACKGROUND

The recent trend in miniaturizing integrated circuits (ICs) has resulted in smaller devices which consume less power yet provide more functionality at higher speeds. For one or more of these advantages to be realized, various developments in IC design and/or manufacture are considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
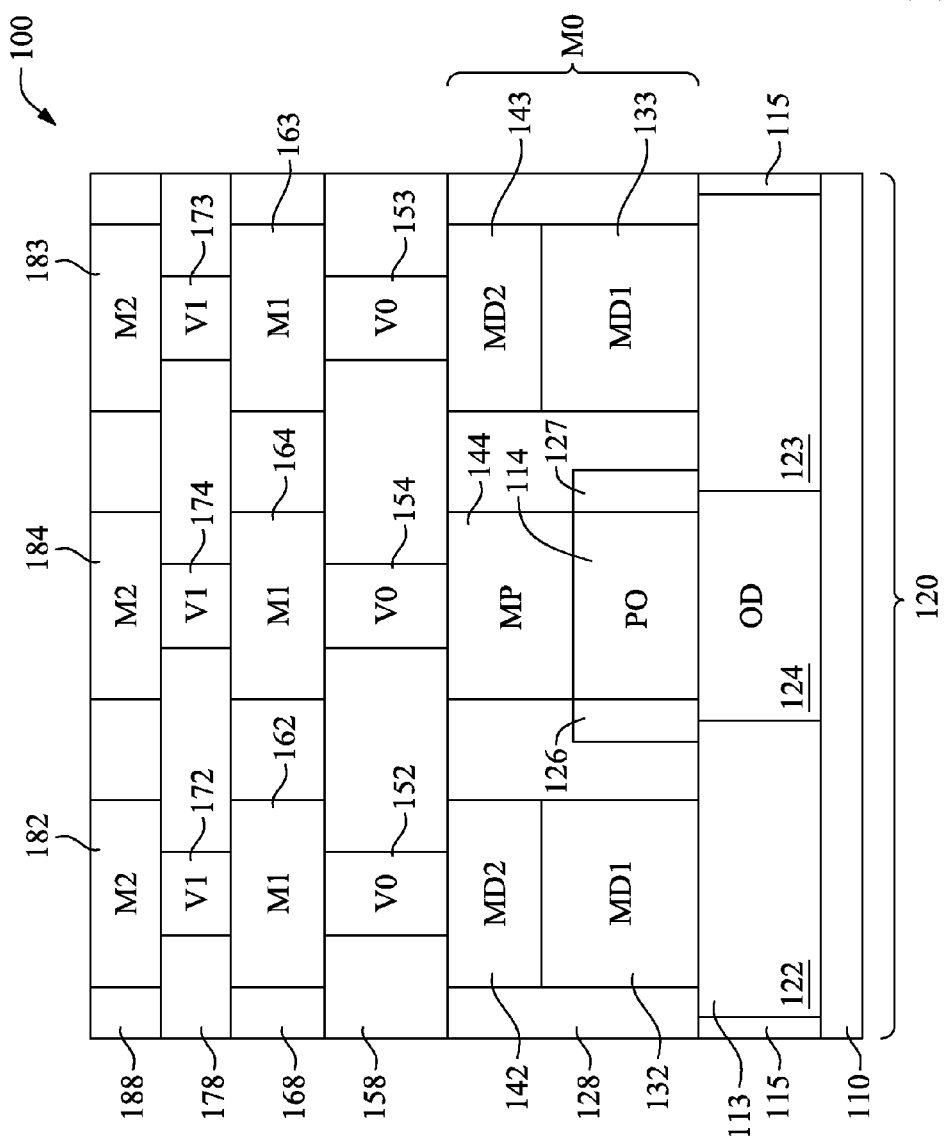
FIG. 1 is a schematic cross-sectional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

A semiconductor device, such as an IC, includes various elements formed over a substrate. A plurality of metal layers and via layers are alternatingly formed over the substrate to electrically couple the elements of the semiconductor device with each other. In some other approaches, a lowermost metal layer among the metal layers defines individual electrical connections to the elements of the semiconductor device, and electrical connections among the elements of the semiconductor device are implemented at higher metal layers which are coupled to the lowermost metal layer via the via layers. In some embodiments, at least one of the electrical connections among the elements of the semiconductor device is implemented by an upper part of the lowermost metal layer. As a result, in some embodiments, one or more of manufacturing time, manufacturing cost, manufacturing material, and size of the semiconductor device is/are reduced compared to the other approaches.

FIG. 1 is a schematic cross-sectional view of a semiconductor device 100, in accordance with some embodiments. The semiconductor device 100 includes a semiconductor substrate 110, and a plurality of elements. An example element 120 is illustrated in FIG. 1.

The semiconductor substrate 110 includes, but is not limited to, bulk silicon, a semiconductor wafer, a silicon-on-insulator (SOI) substrate, or a silicon germanium substrate. Other semiconductor materials including group III, group IV, and group V elements are within the scope of various embodiments.

The elements of the semiconductor device 100 include active elements and/or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drains. Examples of passive elements include, but are not limited to, capacitors, inductors, fuses, and resistors. In the example configuration illustrated in FIG. 1, the element 120 is a transistor.

The transistor 120 includes an active area 113 over the substrate 110, and a gate structure 114 over the active area 113. The active area 113 is isolated from other elements of the semiconductor device 100 by one or more one or more isolation structures 115 also formed over the substrate 110. The active area 113 is referred to herein as an oxide definition (OD) area or pattern and is schematically illustrated in the drawings with the label "OD." The active area 113 is a doped area and includes a source region 122, a drain region 123, and a channel region 124 between the source region 122 and drain region 123. Examples of materials of the active area 113 include, but are not limited to, semiconductor materials doped with various types of p-dopants and/or n-dopants.

The gate structure 114 is over the channel region 124. The gate structure 114 is referred to herein as a poly (PO) pattern and is schematically illustrated in the drawings with the label "PO." Examples of materials of the gate structure 114 include, but are not limited to, metal and polysilicon. The source region 122, the drain region 123, the channel region 124 and the gate structure 114 together define the transistor 120. In at least one embodiment, spacers 126, 127 are formed on opposite sides of the gate structure 114. A dielectric layer 128 is over the transistor 120 and the spacers 126, 127.

Conductive patterns are formed over the transistor 120 to provide electrical connections to the transistor 120. In the example configuration in FIG. 1, conductive segments 132, 133, 142, 143 and 144 are formed in the dielectric layer 128 to provide electrical connection to the gate structure 114, the source region 122 and the drain region 123. The conductive segments 132, 133 are over and electrically coupled to the corresponding source region 122 and drain region 123, and belong to a lower conductive layer referred to herein as MD1 layer or pattern. The MD1 layer is a metal-zero-over-oxide layer and is schematically illustrated in the drawings with the label "MD1." The conductive segments 142, 143 are formed over and electrically coupled to the corresponding conductive segments 132, 133, and belong to an upper conductive layer referred to herein as MD2 layer or pattern. The MD2 layer is also a metal-zero-over-oxide layer and is schematically illustrated in the drawings with the label "MD2." In at least one embodiment, at least one of the conductive segments 142, 143 is in direct electrical contact with the corresponding conductive segment 132 or 133.

The conductive segment 144 is formed over and electrically coupled to the gate structure 114. The conductive segment 144 is referred to herein as a metal-zero-over-polysilicon (MP) layer or pattern and is schematically illustrated in the drawings with the label "MP." In at least one embodiment, the conductive segment 144 is in direct electrical contact with the gate structure 114.

The MP, MD1 and MD2 layers comprise a conductive material and belong to a first (i.e., lowermost) conductive material layer above the elements formed over the substrate 110. In at least one embodiment, the MP, MD1 and MD2 layers comprise a metal and belong to a first metal layer, referred to herein as "M0 layer," i.e., metal-zero (M0) layer, which is the lowermost metal layer of the semiconductor device 100. The M0 layer is schematically illustrated in the drawings with the label "M0." In at least one embodiment, the M0 layer is formed in two steps. For example, in a first step, the lower portion, i.e., the MD1 layer, is formed to be at least partially co-elevational with the gate structure 114 so that at least a portion of the MD1 layer is at the same level as at least a portion of the MD2 layer. In a second step, the upper portion, i.e., the MD2 layer and the MP layer, is formed over the corresponding MD1 layer and gate structure 114.

A dielectric layer 158 is over the dielectric layer 128. One or more vias 152, 153 and 154 are in the dielectric layer 158 to provide electrical connections to the MP and MD2 layers, and then to the transistor 120 via the corresponding gate structure 114 and MD1 layer. For example, the via 152 is in the dielectric layer 158 to provide electrical connection to the underlying conductive segment 142 of the MD2 layer, which is further electrically coupled to the source region 122 via the conductive segment 132 of the MD1 layer. The vias 152, 153 and 154 belong to a via layer V0, i.e., via-zero layer, which is the lowermost via layer of the semiconductor device 100. The V0 layer is schematically illustrated in the drawings with the label "V0." In at least one embodiment, at least one of the vias 152, 153 and 154 is in direct electrical contact with the corresponding conductive segments 142, 143 or 144.

A dielectric layer 168 is over the dielectric layer 158. One or more conductive segments 162, 163 and 164 are in the dielectric layer 168 to provide electrical connections to the corresponding vias 152, 153 and 154. The conductive segments 162, 163 and 164 belong to a second metal layer M1, which is the second lowermost metal layer above the elements formed over the substrate 110 of the semiconductor device 100. The M1 layer is schematically illustrated in the drawings with the label "M1." The described configurations of the M0, V0 and M1 layers are examples. Other configurations are within the scope of various embodiments. For example, in some embodiments, the MD2 layer is omitted in at least one region of the semiconductor device 100, and, in this at least one region of the semiconductor device 100, the V0 layer is electrically connected between the M1 layer and the MD1 layer. In some embodiments, the MP layer is omitted in at least one region of the semiconductor device 100, and, in this at least one region of the semiconductor device 100, the V0 layer is electrically connected between the M1 layer and the corresponding PO pattern(s).

Similarly, a dielectric layer 178 is over the dielectric layer 168. One or more vias 172, 173, and 174 are in the dielectric layer 178 to provide electrical connections to the corresponding conductive segments 162, 163 and 164. The vias 172, 173, and 174 belong to a via layer V1 schematically illustrated in the drawings with the label "V1."

A dielectric layer 188 is over the dielectric layer 178. One or more conductive segments 182, 183 and 184 are in the dielectric layer 188 to provide electrical connections to the corresponding vias 172, 173 and 174. The conductive segments 182, 183 and 184 belong to a metal layer M2 schematically illustrated in the drawings with the label "M2."

At least one of the M1 and M2 layers and at least one of the V0 and V1 layers provide electrical connections between various elements of the semiconductor device 100 and/or between one or more elements of the semiconductor device 100 and external circuitry. The above-described structure is an example configuration, and other arrangements of electrical connections among elements of the semiconductor device 100 are contemplated in various embodiments. For example, in one or more embodiments, one or more further metal layers, e.g., a M3 layer and up, are formed over the M2 layer. The metal layers are connected with each other by one or more via layers, e.g., a via layer V2 and up, each interposed between a pair of adjacent metal layers.

Figure 2:
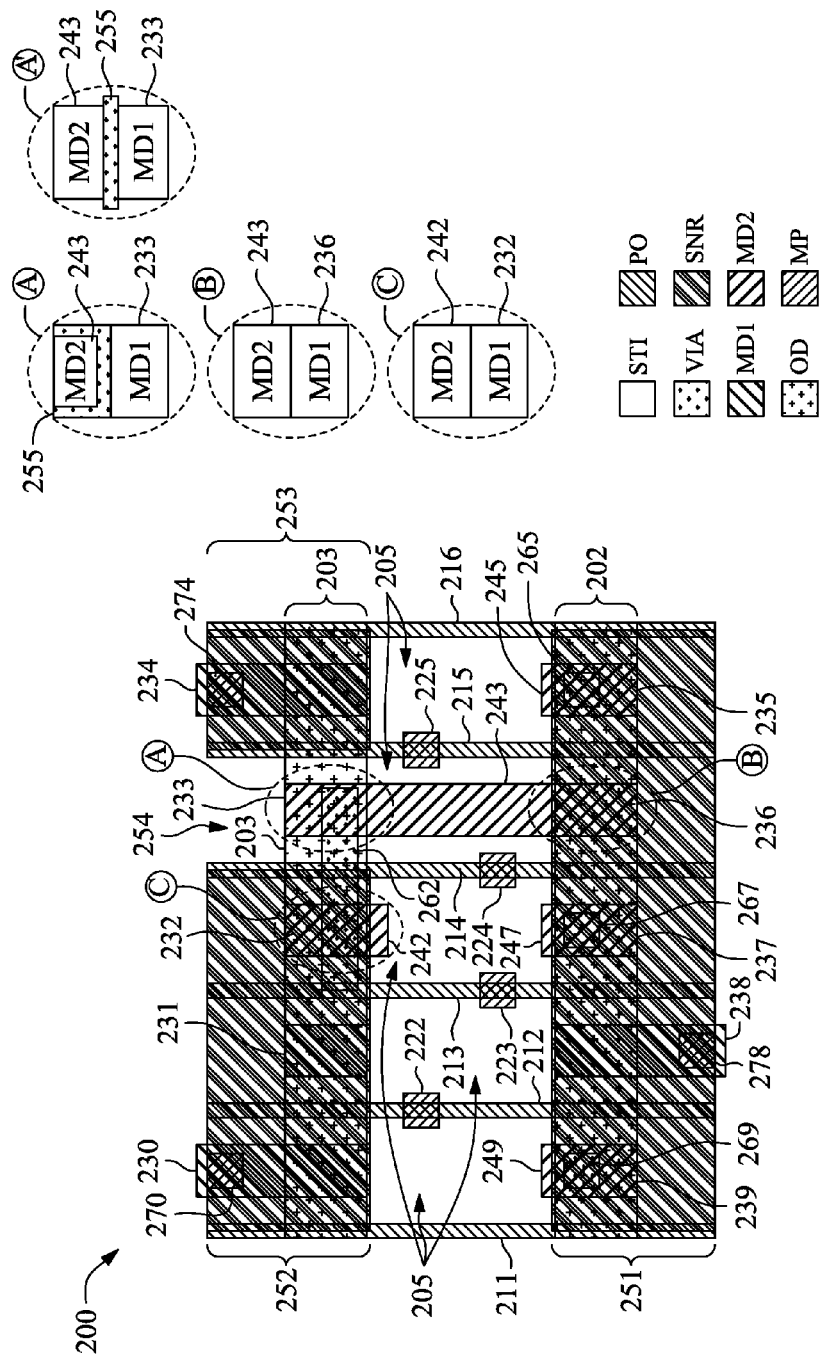
FIG. 2 is a layout of a semiconductor device, in accordance with some embodiments.

FIG. 2 is a layout of a semiconductor device 200, in accordance with some embodiments. The semiconductor device 200 comprises OD patterns 202, 203, isolations structures 205, PO patterns 211-216, MP patterns 222-225, MD1 patterns 230-239, MD2 patterns 242, 243, 245, 247 and 249, silicon-nitride-removal (SNR) regions 251, 252 and 253, a non-SNR region 254, vias and/or metal layers 262, 265, 267 and 269, and further MP patterns 270, 274, and 278.

The OD patterns 202, 203 extend continuously in the width direction (i.e., in the horizontal direction of FIG. 2) of the semiconductor device 200 and are isolated from each other by the isolation structure 205. The OD pattern 202 defines the active areas for one or more elements, such as n-channel metal-oxide semiconductor (NMOS) transistors of the semiconductor device 200. The OD pattern 203 defines the active areas for one or more elements, such as p-channel metal-oxide semiconductor (PMOS) transistors of the semiconductor device 200. The PO patterns 211-216 extend continuously in the height direction (i.e., in the vertical direction of FIG. 2) of the semiconductor device 200. The PO patterns 211-216 extend over the OD patterns 202, 203 and across the isolation structure 205. The PO patterns 211-216 define the gate structures for one or more of the elements having the active areas in the OD patterns 202, 203. The MP patterns 222-225 are formed over and electrically coupled to the corresponding PO patterns 212-215.

The MD1 patterns 230-239 are spaced from each other and are formed over and electrically coupled to the corresponding OD patterns 202, 203. Each of the MD1 patterns 230-239 is between one pair of adjacent PO patterns 211-216. For example, the MD1 pattern 230 is over the OD pattern 203 and between the PO patterns 211-212; the MD1 pattern 231 is over the OD pattern 203 and between the PO patterns 212-213; the MD1 pattern 232 is over the OD pattern 203 and between the PO patterns 213-214; the MD1 pattern 233 is over the OD pattern 203 and between the PO patterns 214-215; the MD1 pattern 234 is over the OD pattern 203 and between the PO patterns 215-216; the MD1 pattern 235 is over the OD pattern 202 and between the PO patterns 215-216; the MD1 pattern 236 is over the OD pattern 202 and between the PO patterns 214-215; the MD1 pattern 237 is over the OD pattern 202 and between the PO patterns 213-214; the MD1 pattern 238 is over the OD pattern 202 and between the PO patterns 212-213; and the MD1 pattern 239 is over the OD pattern 202 and between the PO patterns 211-212. The MD1 patterns 230, 234 and 238 have the corresponding further MP patterns 270, 274, and 278 thereover and are electrically coupled to other elements or external circuitry via the corresponding further MP patterns 270, 274, and 278. The MD1 patterns 232, 233, 235, 236, 237 and 239 have the corresponding MD2 patterns 242, 243, 245, 243, 247 and 249 thereover and are electrically coupled to other elements or external circuitry via the corresponding further MD2 patterns 242, 243, 245, 243, 247 and 249.

The MD2 pattern 242 overlaps and is electrically coupled to the MD1 pattern 232. The MD2 pattern 242 is electrically coupled to the MD2 pattern 243 via at least one via and/or at least one metal segment commonly referred to herein as conductive via/segment 262.

The MD2 pattern 243 overlaps and is electrically isolated from the MD1 pattern 233. The MD2 pattern 243 overlaps and is electrically coupled to the MD1 pattern 236. The MD2 pattern 243 extends continuously from a position over the MD1 pattern 233 to a position over the MD1 pattern 236. The MD2 pattern 243 and the conductive via/segment 262 electrically couples the MD1 pattern 232 to the MD1 pattern 236, while extending over the MD1 pattern 233 without being electrically connected to the MD1 pattern 233.

The MD2 patterns 245, 247 and 249 overlap and are electrically coupled to the corresponding MD1 patterns 235, 237 and 239. The MD2 patterns 245, 247 and 249 are electrically coupled to other elements or external circuitry via the corresponding vias 265, 267 and 269. The vias 265, 267 and 269 belong to the V0 layer which is schematically illustrated in the drawings with the label "VIA." For simplicity, the conductive via/segment 262 is also illustrated in FIG. 2 as belonging to the V0 layer. In some embodiments, the conductive via/segment 262 includes at least a portion in the M1 layer or up and/or in the V1 layer or up. The described configuration of the semiconductor device 200 is an example. Other configurations are within the scope of various embodiments.

Partial, schematic cross-sectional views of regions A, B and C of the semiconductor device 200 are illustrated in FIG. 2. In the SNR regions 251, 252 and 253, a dielectric layer is absent between the MD1 layer and the MD2 layer. As a result, the MD1 patterns 232, 233, 235, 236, 237 and 239 formed in the SNR regions 251, 252 and 253 are electrically coupled to the corresponding MD2 patterns 242, 243, 245, 243, 247 and 249, as described herein and shown in the schematic cross-sectional views of the regions B and C. The SNR regions 252 and 253 sandwich the non-SNR region 254 therebetween. In the non-SNR region 254, a dielectric layer 255 is interposed between the MD1 layer and the MD2 layer as shown in the schematic cross-sectional view of the region A. As a result, the MD2 pattern 243 overlaps but is not electrically coupled to the underlying MD1 pattern 233 as described herein. The MD2 pattern 243 extends continuously between the region A, in which the MD2 pattern 243 is electrically isolated from the underlying MD1 pattern 233, and the region B, in which the MD2 pattern 243 is electrically coupled to the underlying MD1 pattern 236.

In some embodiments, the region A of the semiconductor device 200 has an alternative configuration exemplarily shown in a partial, schematic cross-sectional view A' in FIG. 2. In the configuration shown in the cross-sectional view A, the dielectric layer 255 covers a bottom surface and side surfaces of the MD2 pattern 243, whereas in the cross-sectional view A', the dielectric layer 255 covers the bottom surface of the MD2 pattern 243 without covering the side surfaces of the MD2 pattern 243. In at least one embodiment as exemplarily illustrated in the cross-sectional view A' in FIG. 2, the dielectric layer 255 extends laterally beyond a boundary of the MD2 pattern 243 and/or a boundary of the underlying MD1 pattern 233 to ensure electrical isolation between the MD2 pattern 243 and the underlying MD1 pattern 233 in the region A.

The semiconductor device 200 in accordance with some embodiments includes an electrical connection between the MD1 pattern 232 and the MD1 pattern 236, via the region A corresponding to the MD1 pattern 233 without a short-circuit to the MD1 pattern 233. At least a part of such electrical connection is implemented in the MD2 layer, by the MD2 pattern 243 of the M0 layer. As a result, in at least one embodiment, a via and/or a metal segment in one or more via layers (i.e., the V0 layer and up) and/or higher metal layers (i.e., the M1 layer and up) is omitted, making it possible for reducing one or more of manufacturing time, manufacturing cost, manufacturing material, and size of the semiconductor device 200 compared to other approaches where the electrical connection is implemented in one or more via layers and/or metal layers higher than the M0 layer.

In at least one embodiment, the electrical connection between the MD1 pattern 232 and the MD1 pattern 236 is entirely implemented in the MD2 layer. As a result, in some embodiments, one or more of manufacturing time, manufacturing cost, manufacturing material, and size of the semiconductor device 200 is/are further reduced. For example, in at least one embodiment, the conductive via/segment 262 is replaced with a section of the MD2 pattern 243 which has an L-shape and extends continuously from the region B, to the region C via the region A. The described L-shape of the MD2 pattern 243 is an example. Other shapes, such as T-shape or Z-shape, are within the scope of various embodiments. The MD2 pattern 243 in at least one embodiment electrically couples more than two underlying MD1 patterns and/or extends over (without being electrically coupled to) more than two underlying MD1 patterns. Other arrangements are within the scope of various embodiments.

The described configurations, in which the MD1 and MD2 layers are electrically coupled with each other in some regions, e.g., regions B and C, but are electrically isolated from each other in another region, e.g., region A, are examples. Other configurations are within the scope of various embodiments. For example, in some embodiments where the MD2 layer is omitted, upper and lower portions of the MD1 layer are electrically coupled with each other in some regions but are electrically isolated from each other in another region in a manner similar to that described herein with respect to regions A, B and C. In at least one embodiment, one or more effects achievable with the MD2 presented is/are also achievable when the MD2 layer is omitted.

Figure 3:
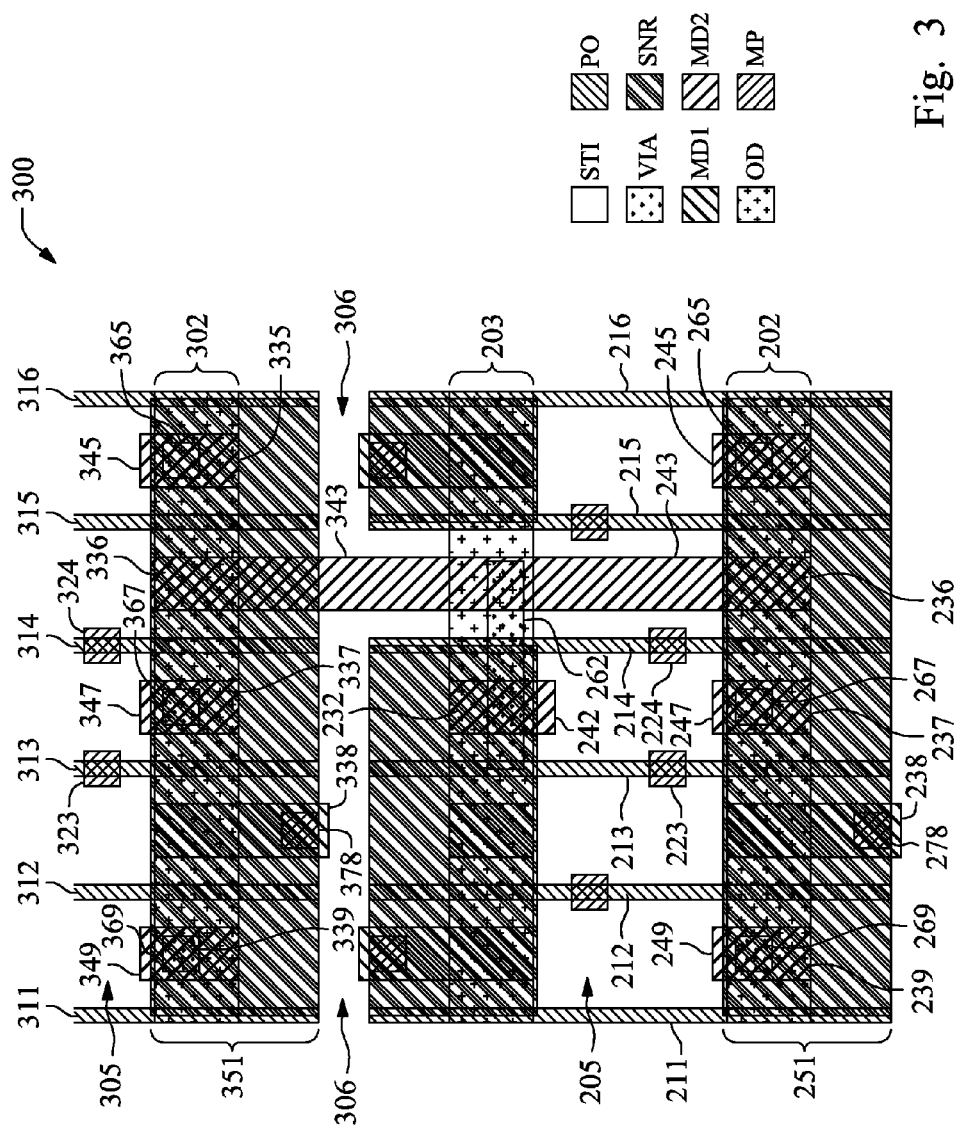
FIG. 3 is a layout of a semiconductor device, in accordance with some embodiments.

FIG. 3 is a layout a semiconductor device 300, in accordance with some embodiments. The semiconductor device 300 includes all elements described with respect to FIG. 2. The semiconductor device 300 further comprises an OD pattern 302, isolations structures 305, 306, PO patterns 311-316, MP patterns 323-324, MD1 patterns 335-339, MD2 patterns 343, 345, 347 and 349, an SNR region 351, and a further MP pattern 378. In at least one embodiment, the OD pattern 302, isolations structures 305, PO patterns 311-316, MP patterns 323-324, MD1 patterns 335-339, MD2 patterns 343, 345, 347 and 349, SNR region 351, and MP pattern 378 correspond to the OD pattern 202, isolations structures 205, PO patterns 211-216, MP patterns 223-324, MD1 patterns 235-339, MD2 patterns 243, 245, 247 and 249, SNR region 251, and MP pattern 278. The OD patterns 302, 203 are isolated from each other by the isolation structure 306. The MD2 pattern 243 is extended into the MD2 pattern 343 which extends continuously and linearly from the MD1 pattern 236 to the MD1 pattern 336, over the MD1 pattern 233 without being electrically coupled to the MD1 pattern 233. As a result, one or more elements having the active areas defined by the OD pattern 302 are electrically connected to one or more elements having the active areas defined by the OD pattern 202, while extending over the MD1 pattern 233 without being electrically coupled to the MD1 pattern 233. In at least one embodiment, one or more effects achievable with respect to the semiconductor device 200 is/are also achievable with respect to the semiconductor device 300.

Figure 4:
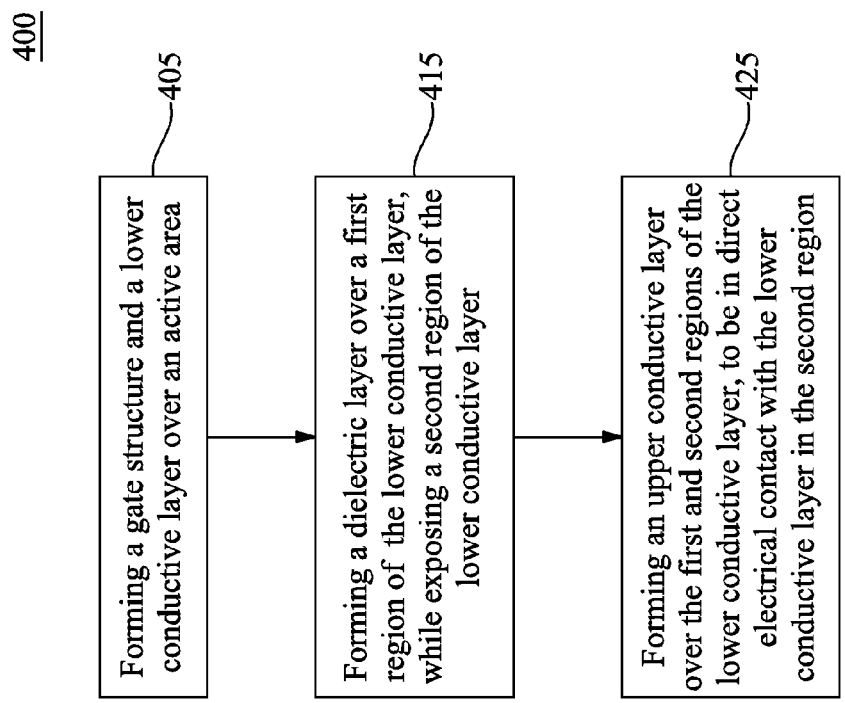
FIG. 4 is a flow chart of a method of manufacturing a semiconductor device, in accordance with some embodiments.

FIG. 4 is a flow chart of a method 400 of manufacturing a semiconductor device, in accordance with some embodiments. FIGS. 5A-5D are schematic cross-sectional views of the semiconductor device at various manufacturing stages, in accordance with some embodiments. In at least one embodiment, the manufacturing stages described with respect to FIGS. 5A-5D result in the configuration described with respect to the cross-sectional view A exemplarily illustrated in FIG. 2.

Figure 5A:
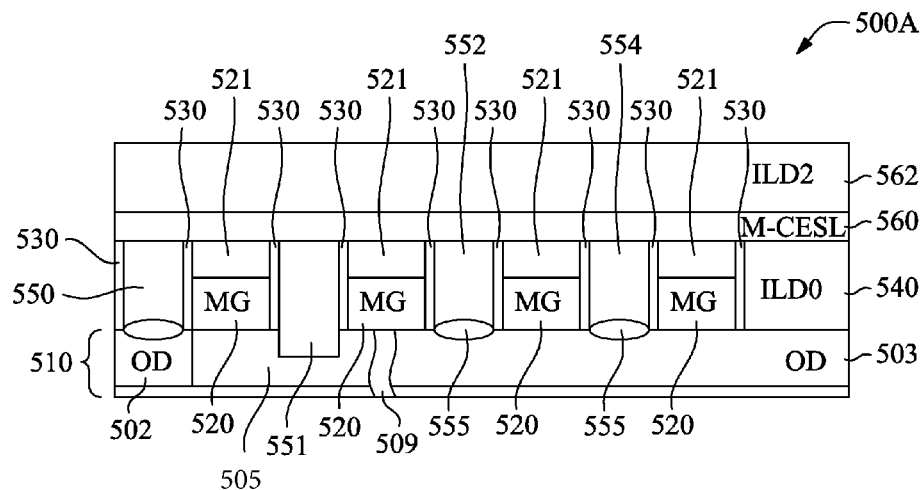
FIGS. 5A-5D are schematic cross-sectional views of a semiconductor device at various manufacturing stages, in accordance with some embodiments.

At operation 405 of the method 400, a gate structure and a lower conductive layer are formed over a substrate. For example, as shown in FIG. 5A, one or more gate structures 520 (schematically illustrated in the drawings with the label "MG") are formed on a substrate 510. The substrate 510 comprises, in at least one embodiment, a silicon substrate. The substrate 510 comprises, in at least one embodiment, silicon germanium (SiGe), Gallium arsenic, or other suitable semiconductor materials. In at least one embodiment, shallow trench isolation (STI) regions 505 are formed in the substrate 510 for isolating active areas 502, 503 in the substrate 510. Example materials of the STI regions 505 include, but are not limited to, silicon oxide, silicon nitride, silicon oxynitride, fluoride-doped silicate, and/or any other low k dielectric materials. In some embodiments, the substrate 510 further includes one or more other features, such as various doped regions, a buried layer, and/or an epitaxy (epi) layer. In some embodiments, the substrate 510 comprises a semiconductor on insulator, such as silicon on insulator (SOI). In some embodiments, the substrate 510 includes a doped epi layer, a gradient semiconductor layer, and/or a semiconductor layer overlying another semiconductor layer of a different type such as a silicon layer on a silicon germanium layer.

In some embodiments, the gate structure 520 formed over the substrate 510 includes a gate dielectric over the substrate 510. Example materials of the gate dielectric include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The thickness of the high-k dielectric layer is in the range of, for instance, about 5-about 40 Å. In some embodiments, the gate dielectric is formed over the substrate 510 by atomic layer deposition (ALD) or other suitable techniques.

The gate structure 520 further includes a gate electrode formed over the gate dielectric. The thickness of the gate electrode ranges, for instance, from about 10 to about 500 Å. The gate electrode is formed of poly-silicon or metal. In one or more embodiments, the gate electrode comprises Al, AlTi, Ti, TiN, TaN, Ta, TaC, TaSiN, W, WN, MoN, and/or other suitable conductive materials. In some embodiments, the gate electrode is formed by chemical vapor deposition (CVD), physical vapor deposition (PVD or sputtering), plating, atomic layer deposition (ALD), and/or other suitable processes.

In one or more embodiments, a hard mask 521 is formed over each of the gate structures 520. The hard mask 521 includes silicon nitride, silicon oxynitride, silicon carbide or other suitable materials. The hard mask 521 is formed, in at least one embodiment, by a deposition process or any suitable methods, and used as a mask to pattern the gate structure 520.

Spacers 530 are formed on sidewalls of the gate structures 520. The spacer 530 comprises, for instance, a dielectric layer. In one or more embodiments, the spacer 530 is formed of silicon nitride. Another example of the spacer 530 includes oxynitride. In another example, the spacer 530 is silicon carbide. In some embodiments, the spacer 530 contains impurity, such as boron, carbon, fluorine, or combinations thereof. In some embodiments, the spacer 530 is formed by suitable methods. First, a layer for the spacer 530 is deposited over the gate structure 520 and the substrate 510, for example, by plasma enhanced chemical vapor deposition (PECVD), low-pressure chemical vapor deposition (LPCVD), sub-atmospheric chemical vapor deposition (SACVD), atomic layer deposition (ALD), and the like. The layer for the spacer 530 is formed to have a suitable thickness, e.g., in the range of about 50 Å to about 400 Å. Further, the deposited layer for the spacer 530 is patterned to form the spacer 530 in contact or adjacent to the sidewalls of the gate structure 520. The patterning is performed, in at least one embodiment, by suitable techniques, such as a wet etch process, a dry etch process, or combinations thereof. In one or more embodiments, the patterning to form the spacer 530 is conducted by an anisotropic dry etching process.

The above description where the gate structure 520 is formed before the spacer 530 is referred to as a gate-first process. In an alternative, gate-last process, the same or similar steps of the gate-first process is performed to form a dummy gate, e.g., dummy poly-silicon, and the spacer 530. The dummy gate is replaced afterwards with a suitable metal or conductive material to obtain the gate structure 520.

Further, source and drain regions are formed in an active area of the substrate 510 by using the gate structure 520 and the spacer 530 as a mask. Thus, the active area includes the gate structure 520 and the source and drain regions adjacent the gate structure 520. For example, the formation of the source/drain regions is performed by an ion implantation or a diffusion process. Depending on the type of the semiconductor device, the source/drain regions are doped with p-type dopants, such as boron or $BF_2$, n-type dopants, such as phosphorus or arsenic, and/or combinations thereof. In some embodiments, lightly doped source/drain (LDD) regions are formed in the substrate 510 prior to the formation of the spacer 530, by one or more implantation processes, such as an ion implantation process.

An inter-layer dielectric (ILD) layer 540 is formed over the substrate 510. The ILD layer 540 is also referred to herein as an ILD0 layer. Example materials of the ILD layer 540 include, but are not limited to, SiNx, SiOx, SiON, SiC, SiBN, SiCBN, or combinations thereof. In at least one embodiment, the ILD layer 540 is formed using high-density plasma (HDP), although other methods such as Sub-Atmospheric Pressure Chemical Vapor Deposition (SACVD), Lower Pressure Chemical Vapor Deposition (LPCVD), ALD, Plasma enhanced ALD (PEALD), Plasma enhanced CVD (PECVD), Monolayer Deposition (MLD), Plasma Impulse CVD (PICVD), spin-on, or the like are used in various embodiments.

A planarizing process is performed to remove the ILD layer 540 to expose the hard masks 521. The planarizing process comprises, for example, a chemical mechanical polish (CMP) process. In some embodiments, the hard masks 521 are removed by the planarizing process or another etching and/or CMP process to expose the underlying gate structure 520. In some embodiments, the gate structure 520 are removed and replaced with metal gates in a gate-last process as described herein.

A further ILD layer, referred to herein as an ILD1 layer, is formed over the planarized ILD layer 540. In some embodiments, a hard mask layer is formed over the ILD1 layer. Contact openings are formed in the ILD1 layer and the ILD layer 540 by an etching process to expose the source/drain regions and/or the gate structures. A conductive material is formed to fill the contact openings, to obtain conductive segments 550, 551, 552, 554 of the MD1 layer. In the example configuration illustrated in FIG. 5A, the conductive segment 551 extends at least partially into the STI region 505, whereas conductive segments 550, 552, 554 make electrical connection with the corresponding exposed source/drain regions.

According to one or more embodiments, before forming the conductive segments 550, 551, 552, 554 of the MD1 layer, a silicidation (e.g., self-aligned silicidation) process or a suitable method is performed to provide the top surfaces of the source/drain regions with silicided regions 555 as contact features. For example, a metal layer is blanket-deposited over the exposed source/drain regions, and then an annealing step is performed to form metal silicide layers on the source/drain regions. Un-reacted metal is subsequently removed, e.g., by a wet chemical etch.

A planarizing process is performed to planarized the MD1 layer. A contact etch stop layer (CESL) 560 is formed over the planarized MD1 layer. Example materials of the CESL layer 560 include, but are not limited to, SiNx, SiOx, SiON, SiC, SiCN, BN, SiBN, SiCBN, or combinations thereof. A further ILD layer 562, referred to herein as an ILD2 layer, is formed over the CESL layer 560. A resulting structure 500A is obtained as shown in FIG. 5A. The symbol 509 schematically illustrates that the described structures are arranged in various regions which are not continuously in one or more embodiments.

Figure 5B:
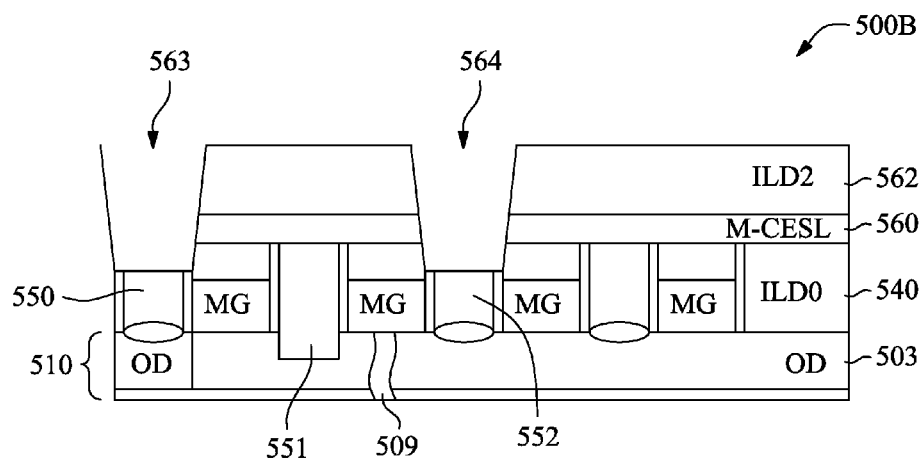

At operation 415 of the method 400, a dielectric layer is formed over a first region of the lower conductive layer, while exposing a second region of the lower conductive layer. For example, as shown in FIG. 5B, openings 563, 564 are etched in the ILD layer 562 and the CESL layer 560 to expose the corresponding underlying conductive segments 550, 552 of the MD1 layer. A resulting structure 500B is obtained as shown in FIG. 5B.

Figure 5C:
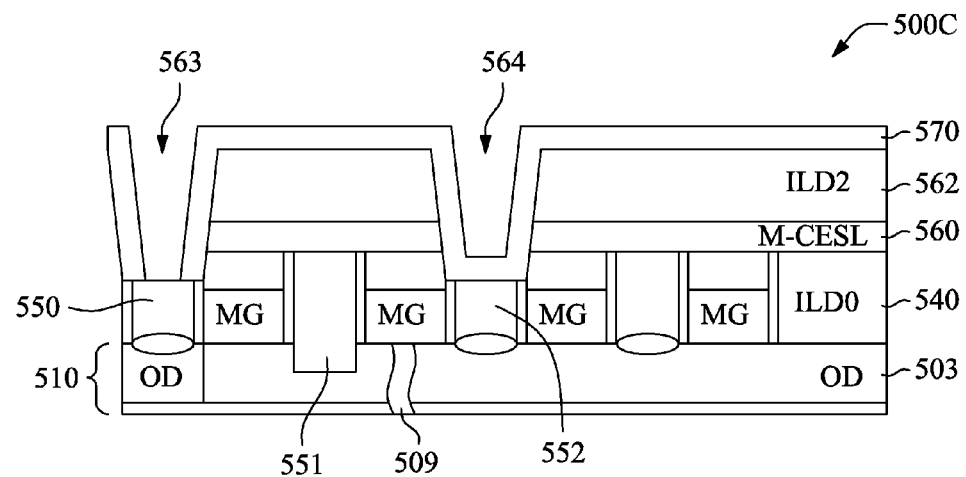

As shown in FIG. 5C, a dielectric layer 570 is blanket-deposited over the substrate 510 to line sidewalls and bottoms of the openings 563, 564. In some embodiments, the dielectric layer 570 is deposited by an ALD process. An example material of the dielectric layer 570 includes, but is not limited to, silicon nitride. The dielectric layer 570 is selectively removed, e.g., by a photolithography process followed by an etching process, from the bottom of the opening 563 to expose the underlying conductive segment 550. The dielectric layer 570 remains over the bottom of the opening 564 so as not to expose the underlying conductive segment 552. A resulting structure 500C is obtained as shown in FIG. 5C.

Figure 5D:
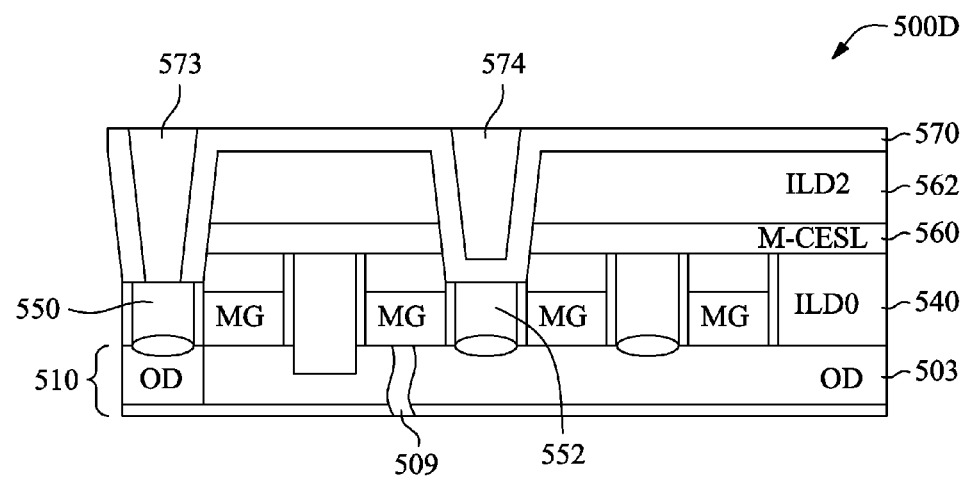

At operation 425 of the method 400, an upper conductive layer is formed over the first and second regions of the lower conductive layer, to be in direct electrical contact with the lower conductive layer in the second region. For example, as show in FIG. 5D, a conductive material is formed to fill the openings 563, 564 and then planarized, to obtain corresponding conductive segments 573, 574 of the MD2 layer. In some embodiments, the conductive segments 573, 574 are continuous to each other as described herein with respect to the MD2 patterns 243, 343 in FIGS. 2-3. The conductive segment 574 of the MD2 layer is electrically isolated from the underlying conductive segment 552 of the MD1 layer by a portion of the dielectric layer 570 remaining at the bottom of the opening 564. In at least one embodiment, the electrical isolation between the conductive segment 574 of the MD2 layer and the underlying conductive segment 552 of the MD1 layer by a portion of the dielectric layer 570 corresponds to the configuration A exemplarily illustrated in FIG. 2. The conductive segment 573 of the MD2 layer is in direct electrical contact with the underlying conductive segment 550 of the MD1 layer because the dielectric layer 570 is absent at the bottom of the opening 563. In at least one embodiment, the electrical contact between the conductive segment 573 of the MD2 layer and the underlying conductive segment 550 of the MD1 layer corresponds to the configuration B or C exemplarily illustrated in FIG. 2. In some embodiments, the MD1 layer and the MD2 layer comprise different conductive materials. In some embodiments, the MD1 layer and the MD2 layer comprise the same conductive material. In some embodiments, the formation of at least one of the MD1 layer or MD2 layer includes depositing a glue (or seed) metal layer before filling the corresponding conductive material(s) in the corresponding openings. A resulting semiconductor device 500D is obtained as shown in FIG. 5D. In some embodiments where the MD2 layer is omitted, an upper lower portion of the MD1 layer is formed to be electrically coupled with a lower portion of the MD1 layer in some regions, but electrically isolated from the lower portion of the MD1 layer in another region in a manner similar to that described herein with respect to the formation of the MD2 layer in operation 425. One or more effects discussed herein with respect to FIGS.

2-3 is/are obtainable in the manufacturing method in accordance with some embodiments.

FIGS. 6A-6D are schematic cross-sectional views of a semiconductor device at various manufacturing stages of the manufacturing method 400, in accordance with some embodiments. In at least one embodiment, the manufacturing stages described with respect to FIGS. 6A-6D result in the configuration described with respect to the cross-sectional view A' exemplarily illustrated in FIG. 2.

Figure 6A:
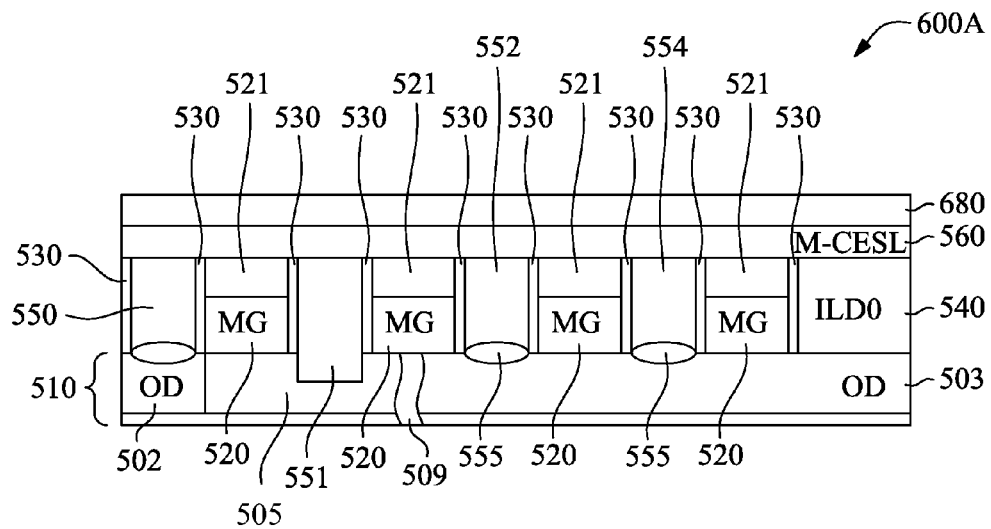
FIGS. 6A-6D are schematic cross-sectional views of a semiconductor device at various manufacturing stages, in accordance with some embodiments.

At operation 405 of the method 400, a gate structure and a lower conductive layer are formed over a substrate. For example, as shown in FIG. 6A, one or more gate structures 520, as well as the hard masks 521, spacers 530, ILD layer 540, conductive segments 550, 551, 552, 554 and CESL layer 560, are formed over the substrate 510 in manners similar to those described with respect to FIG. 5A.

At operation 415 of the method 400, a dielectric layer is formed over a first region of the lower conductive layer, while exposing a second region of the lower conductive layer. For example, as shown in FIG. 6A, a dielectric layer 680 is deposited over the CESL layer 560. In some embodiments, the dielectric layer 680 is deposited by an ALD process. Example materials of the dielectric layer 680 include, but are not limited to, silicon nitride, oxide, $Al_2O_x$, and other suitable electrically insulating materials. A resulting structure 600A is obtained as shown in FIG. 6A.

Figure 6B:
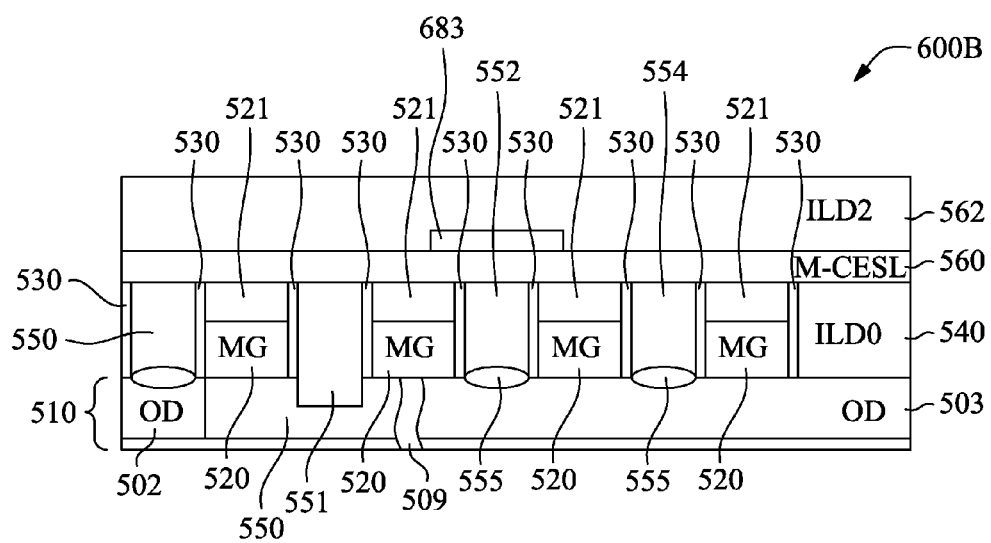

As shown in FIG. 6B, the dielectric layer 680 is selectively removed, e.g., by a photolithography process followed by an etching process, to leave an insulating portion 683 of the dielectric layer 680 over the conductive segment 552 which is to be electrically isolated from an overlying conductive segment as described herein with respect to the configuration A' exemplarily illustrated in FIG. 2. An ILD layer 562 is formed over the obtained structure, including the insulating portion 683. A resulting structure 600B is obtained as shown in FIG. 6B.

Figure 6C:
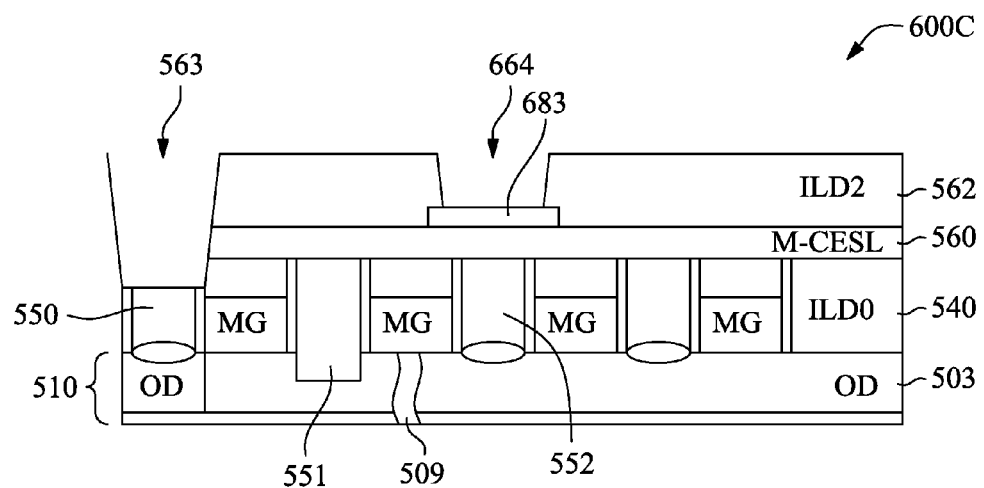

As shown in FIG. 6C, an opening 563 is etched in the ILD layer 562 and the CESL layer 560 to expose the corresponding underlying conductive segment 550 of the MD1 layer, and an opening 664 is etched in the ILD layer 562 to expose the insulating portion 683. A resulting structure 600C is obtained as shown in FIG. 6C.

Figure 6D:
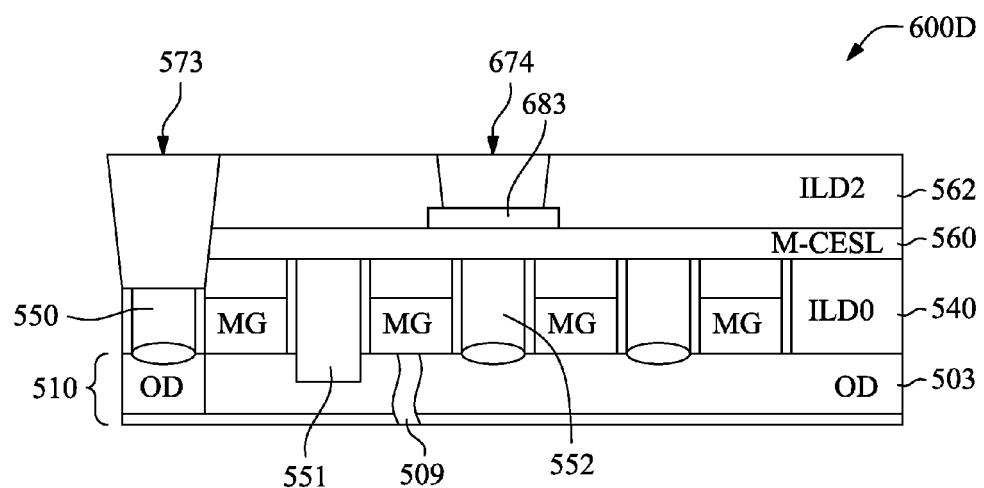

At operation 425 of the method 400, an upper conductive layer is formed over the first and second regions of the lower conductive layer, to be in direct electrical contact with the lower conductive layer in the second region. For example, as show in FIG. 6D, a conductive material is formed to fill the openings 563, 664 and then planarized, to obtain corresponding conductive segments 573, 674 of the MD2 layer. In some embodiments, the conductive segments 573, 674 are continuous to each other as described herein with respect to the MD2 patterns 243, 343 in FIGS. 2-3. The conductive segment 674 of the MD2 layer is electrically isolated from the underlying conductive segment 552 of the MD1 layer by the insulating portion 683. In at least one embodiment, the electrical isolation between the conductive segment 674 of the MD2 layer and the underlying conductive segment 552 of the MD1 layer by the insulating portion 683 corresponds to the configuration A' exemplarily illustrated in FIG. 2. A resulting semiconductor device 600D is obtained as shown in FIG. 6D. One or more effects discussed herein with respect to FIGS. 2-3 is/are obtainable in the manufacturing method in accordance with some embodiments.

The above method(s) include(s) example operations, but the operations in some embodiments are not performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In summary, one or more embodiments implement at least a part of an electrical connection between elements of a semiconductor device in an MD2 layer which is the upper part of the M0 layer. The part of the electrical connection implemented in the MD2 layer overlies and is electrically isolated from a underlying portion of an MD1 layer, which is the lower part of the M0 layer. As a result, in some embodiments, one or more of manufacturing time, manufacturing cost, manufacturing material, and size of the semiconductor device is/are reduced compared to the other approaches.

In some embodiments, a semiconductor device comprises a substrate having an active area, a gate structure over the active area, a lower conductive layer over and electrically coupled to the active area, and an upper conductive layer over and electrically coupled to the lower conductive layer. The lower conductive layer is at least partially co-elevational with the gate structure. The lower conductive layer comprises first and second conductive segments spaced from each other. The upper conductive layer comprises a third conductive segment overlapping the first and second conductive segments. The third conductive segment is electrically coupled to the first conductive segment, and is electrically isolated from the second conductive segment.

In some embodiments, a layout of a semiconductor device comprises an active area, a metal zero layer, and a dielectric layer. The metal zero layer comprises a lower metal layer over the active area, and an upper metal layer over the lower metal layer. The dielectric layer is interposed between the lower metal layer and the upper metal layer in a first region of the metal zero layer. The dielectric layer is absent between the lower metal layer and the upper metal layer in a second region of the metal zero layer.

In a method of manufacturing a semiconductor device in accordance with some embodiments, a gate structure is formed over an active area of a substrate. A lower conductive layer is formed over the active area. The lower conductive layer is at least partially co-elevational with the gate structure. A first dielectric layer is formed over a first region of the lower conductive layer, while exposing a second region of the lower conductive layer. An upper conductive layer is formed over both the first and second regions of the lower conductive layer. The upper conductive layer is in direct electrical contact with the lower conductive layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having an active area;
   a gate structure over the active area;

a lower conductive layer over and electrically coupled to the active area, the lower conductive layer at least partially co-elevational with the gate structure, and the lower conductive layer comprising a first conductive segment laterally spaced from a second conductive segment; and an upper conductive layer comprising a third conductive segment overlapping the first conductive segment at a first position and overlapping the second conductive segment at a second position, wherein the third conductive segment extends continuously from the first position to the second position, the third conductive segment directly contacts the first conductive segment, and the third conductive segment is electrically isolated from the second conductive segment.

2. The semiconductor device of claim 1, wherein the upper conductive layer further comprises a fourth conductive segment overlapping and in direct contact with the gate structure.

3. The semiconductor device of claim 2, wherein the fourth conductive segment is in direct electrical contact with the gate structure.

4. The semiconductor device of claim 1, further comprising:

a first dielectric layer over the lower conductive layer, the first dielectric layer comprising a first opening over the first conductive segment and a second opening over the second conductive segment, wherein the third conductive segment is arranged in the first and second openings, and the third conductive segment in the first opening directly contacts the first conductive segment at a bottom of the first opening.

5. The semiconductor device of claim 4, further comprising:

a second dielectric layer at a bottom of the second opening to electrically isolate the third conductive segment in the second opening from the second conductive segment, wherein the second dielectric layer covers sidewalls of the third conductive segment in the second opening.

6. The semiconductor device of claim 4, further comprising:

a second dielectric layer at a bottom of the second opening to electrically isolate the third conductive segment in the second opening from the second conductive segment, wherein the second dielectric layer does not cover sidewalls of the third conductive segment in the second opening.

7. The semiconductor device of claim 1, further comprising:

a plurality of metal layers and a plurality of via layers alternatingly arranged over the upper conductive layer, wherein a lowermost via layer among the plurality of via layers is in direct electrical contact with the upper conductive layer.

8. The semiconductor device of claim 1, wherein the lower conductive layer further comprises a fourth conductive segment spaced from the first and second conductive segments, the third conductive segment comprises:
a first portion overlapping and in direct contact with the first conductive segment,
a second portion overlapping and electrically isolated from the second conductive segment, and
a third portion overlapping and in direct contact with the fourth conductive segment, and the third conductive segment extends continuously from the first portion via the second portion to the third portion.

9. The semiconductor device of claim 1, wherein the lower conductive layer further comprises a fourth conductive segment spaced from the first and second conductive segments, the upper conductive layer further comprises a fifth conductive segment spaced from the third conductive segment, the fifth conductive segment overlapping and electrically coupled to the fourth conductive segment, the third conductive segment comprises:
a first portion overlapping and in direct contact with the first conductive segment, and
a second portion overlapping and electrically isolated from the second conductive segment, and the semiconductor device further comprises:
at least one via layer over and electrically coupled to the upper conductive layer, and
at least one metal layer over and electrically coupled to the at least one via layer, the at least one metal layer and the at least one via layer electrically coupling the third and fifth conductive segments of the upper conductive layer.

10. A layout of a semiconductor device, the layout comprising:

an active area having a gate structure thereon;
a metal zero layer, comprising:
a lower metal layer over the active area, the lower metal layer being at least partially co-elevational with the gate structure, and
an upper metal layer overlying and in direct contact with the lower metal layer; and
a dielectric layer interposed between the lower metal layer and the overlying upper metal layer in a first region of the metal zero layer, wherein
the dielectric layer is absent between the lower metal layer and the overlying upper metal layer in a second region of the metal zero layer, and
the upper metal layer comprises a metal segment extending continuously from the first region to the second region of the metal zero layer.

11. The layout of claim 10, wherein the upper metal layer is over the gate structure.

12. The layout of claim 10, wherein the metal segment has a shape selected from the group consisting of an L-shape, a Z-shape and a T-shape.

13. The layout of claim 10, wherein the dielectric layer is absent between the lower metal layer and the upper metal layer in a third region of the metal zero layer, and the metal segment extends continuously from the third region via the first region to the second region of the metal zero layer.

14. The layout of claim 10, further comprising:

at least one metal layer and at least one via layer arranged over the metal zero layer, wherein the dielectric layer is absent between the lower metal layer and the upper metal layer in a third region of the metal zero layer, the upper metal layer comprises a further metal segment in the third region and spaced from the metal segment in the first and second regions, and the at least one metal layer and the at least one via layer electrically couple the metal segment in the first region and the further metal segment in the third region.

15. The layout of claim 10, wherein the metal segment overlies an isolation structure.

16. A method of manufacturing a semiconductor device, the method comprising:
forming a gate structure over an active area of a substrate;
forming a lower conductive layer over the active area, the lower conductive layer at least partially co-elevational with the gate structure, wherein the lower conductive layer comprises a first conductive segment on a first side of the gate structure and a second conductive segment on a second side of the gate structure opposite the first side;
depositing a first dielectric layer over the first conductive segment and the second conductive segment;
etching the first dielectric layer to expose at least a portion of the first conductive segment;
maintaining the first dielectric layer over an entirety of the second conductive segment; and
depositing an upper conductive layer over the first dielectric layer, wherein the upper conductive layer is in direct contact with the first conductive segment, is over the second conductive segment, and extends continuously from the first conductive segment to the second conductive segment.

17. The method of claim 16, further comprising:
forming a second dielectric layer over the lower conductive layer; and
removing portions of the second dielectric layer over the first and second regions of the lower conductive layer to expose the first and second regions of the lower conductive layer,
wherein said forming the first dielectric layer comprises:
depositing a dielectric material over a remaining portion of the second dielectric layer and over the first and second regions of the lower conductive layer exposed by the removed portions of the second dielectric layer, and
removing the dielectric material over the second region of the lower conductive layer to expose the second region of the lower conductive layer, while maintaining the dielectric material over the first region of the lower conductive layer.

18. The method of claim 17, wherein
said forming the metal segment of the upper conductive layer comprises:
depositing a conductive material over a remaining portion of the dielectric material and over the second region of the lower conductive layer exposed by the removed portion of the dielectric material, and
removing the conductive material over the remaining portion of the dielectric material and leaving the conductive material over the first and second regions of the lower conductive layer.

19. The method of claim 16, wherein
said forming the first dielectric layer comprises:
forming an insulating portion over the lower conductive layer in the first region but not in the second region,
forming a second dielectric layer over the insulating portion, and
removing portions of the second dielectric layer over the first and second regions to expose the second region of the lower conductive layer and the insulating portion, and
said forming the metal segment of the upper conductive layer comprises:
depositing a conductive material over a remaining portion of the second dielectric layer, over the exposed second region of the lower conductive layer and over the exposed insulating portion, and
removing the conductive material over the remaining portion of the second dielectric layer and leaving the conductive material over the exposed second region of the lower conductive layer and over the exposed insulating portion.

* * * * *